US007722916B2

(12) United States Patent
Wang et al.

(10) Patent No.: US 7,722,916 B2

(45) Date of Patent: May 25, 2010

(54) METHODS FOR CONTROLLING PLASMA SPRAY COATING POROSITY ON AN ARTICLE AND ARTICLES MANUFACTURED THEREFROM

(75) Inventors: Hsin-Pang Wang, Rexford, NY (US); Michael Charles Ostrowski, Glenville, NY (US); Eric Moran, Niskayuna, NY (US); Stephen Gerard Pope, Roebuck, SC (US); John Drake Vanselow, Taylors, SC (US); Edward Richard Haupt, Greenville, SC (US)

(73) Assignee: General Electric Company, Niskayuna, NY (US)

( * ) Notice: Subject to any disclaimer, the term of this patent is extended or adjusted under 35 U.S.C. 154(b) by 693 days.

(21) Appl. No.: 11/420,867

(22) Filed: May 30, 2006

(65) Prior Publication Data

US 2007/0281074 A1 Dec. 6, 2007

(51) Int. Cl.
*C23C 16/52* (2006.01)

(52) U.S. Cl. ........................................ 427/8; 427/421.1

(58) Field of Classification Search ............... 427/421.1
See application file for complete search history.

(56) References Cited

U.S. PATENT DOCUMENTS 4,358,471 A 11/1982 Derkacs et al.
5,858,470 A * 1/1999 Bernecki et al. ............ 427/453
6,256,597 B1 * 7/2001 Wang et al. .................... 703/2
6,745,158 B1 6/2004 Eickmeyer et al.

FOREIGN PATENT DOCUMENTS

| | | |
|---|---|---|
| DE | 19504933 | 8/1996 |
| DE | 10041882 | 3/2002 |
| DE | 10038816 | 6/2002 |
| WO | 0249772 | 6/2002 |

OTHER PUBLICATIONS

EP Search Report, EP07108726, Sep. 7, 2007.
DE10038816 Abstract.
DE10041882 Abstract.
DE19504933 Abstract.

* cited by examiner

*Primary Examiner*—Timothy H Meeks
*Assistant Examiner*—Nathan T Leong
(74) *Attorney, Agent, or Firm*—Ann M. Agosti

(57) ABSTRACT

Disclosed herein is a spray coating process for a robotic spray gun assembly comprising importing a discretized model of an object geometry to be coated; importing a numerically characterized spray pattern file; importing a robot motion file comprising a plurality of motion positions, dwell times and orientations defining a spray direction of the robotic spray gun; reading each motion position within the motion file; determining which portions of the object geometry are visible at each motion position; computing a void volume fraction at each visible portion of the object geometry based on the core compression, the incident angle of the robotic spray gun and the ricocheting of the spray for each motion position; and calculating total coating thickness on portions of the object geometry for the complete motion step.

13 Claims, 14 Drawing Sheets

METHODS FOR CONTROLLING PLASMA SPRAY COATING POROSITY ON AN ARTICLE AND ARTICLES MANUFACTURED THEREFROM

BACKGROUND

This disclosure relates to methods for controlling plasma spray coating porosity on an article and articles manufactured therefrom.

Spray coating processes such as air plasma processes, vacuum plasma processes, high velocity oxygen fuel thermal spray processes, and the like, are used to coat turbine buckets. These processes may produce coatings that are partially porous. Porosity in coatings may be detrimental to the performance and life of the turbine bucket. In order to repair turbine buckets that have coatings with excess porosity, it is necessary to strip and recoat them. Stripping and recoating the turbine buckets is time consuming and expensive. Moreover there is no assurance that porosity level will be acceptable after the recoating of the bucket.

The porosity in the coatings is influenced by several factors. One factor is the deposition of non-molten or partially molten particles on the turbine bucket during the coating process. Non-molten or partially molten particles are generally deposited on the coated surface in a porous ring along the edge of the spray cone. Another factor is the rebounding of non-molten particles from concave surfaces on the turbine bucket. Yet another factor is the rebounding of non-molten particles from surfaces upon which the spray impinges. There is also an interplay amongst the aforementioned three factors that may produce porosity in the coating.

It is therefore desirable to develop a method for spray coating turbine buckets that determines the contribution to porosity from each of the aforementioned factors and their respective interactions with one another and that can be used to control porosity in the coating on the turbine buckets.

SUMMARY

Disclosed herein is a spray coating process for a robotic spray gun assembly comprising importing a discretized model of an object geometry to be coated; importing a numerically characterized spray pattern file; importing a robot motion file comprising a plurality of motion positions, dwell times and orientations defining a spray direction of the robotic spray gun; reading each motion position within the motion file; determining which portions of the object geometry are visible at each motion position; computing a void volume fraction at each visible portion of the object geometry based on the core compression, the incident angle and the ricocheting of the spray for each motion position; and calculating total coating thickness on portions of the object geometry for the complete motion step.

Disclosed herein too is a system for predicting spray-coating thickness in a robotic spray-gun process, comprising an importer for importing a discretized model of an object geometry; a spray pattern database containing a plurality of numerically characterized spray pattern files; a robot motion database containing a plurality of robot motion files; and a geometric tracking module for computing a spray coating thickness at each position in a respective robot motion file by reading each position; determining which portions of the object geometry are visible at each position; computing a void volume fraction at each position based upon core compression, the incident angle of the robotic spray-gun and a ricocheting factor; computing a coating thickness at each visible portion of the object geometry based on the spray pattern data, the dwell time and the orientation of the robot motion path for each motion position; and calculating total coating thickness for the complete motion step file.

DETAILED DESCRIPTION OF FIGURES

FIG. 1 is a schematic depiction of the application of a spray coating to a surface from a spray gun. In this Figure it can be seen that the spray coating is emitted from the spray gun in the form of a cone. The coating has a thicker central portion where core compression occurs and a thinner outer ring where there is a significant contribution to the porosity in the coating. This is mainly due to the hot central core of the spray plume where particles are easier to melt;

Figure 6A:
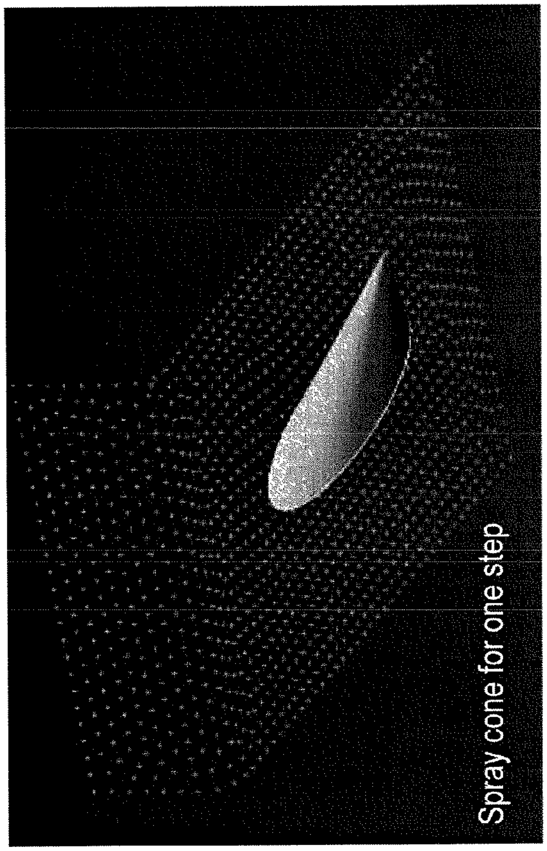
Figure 6B:
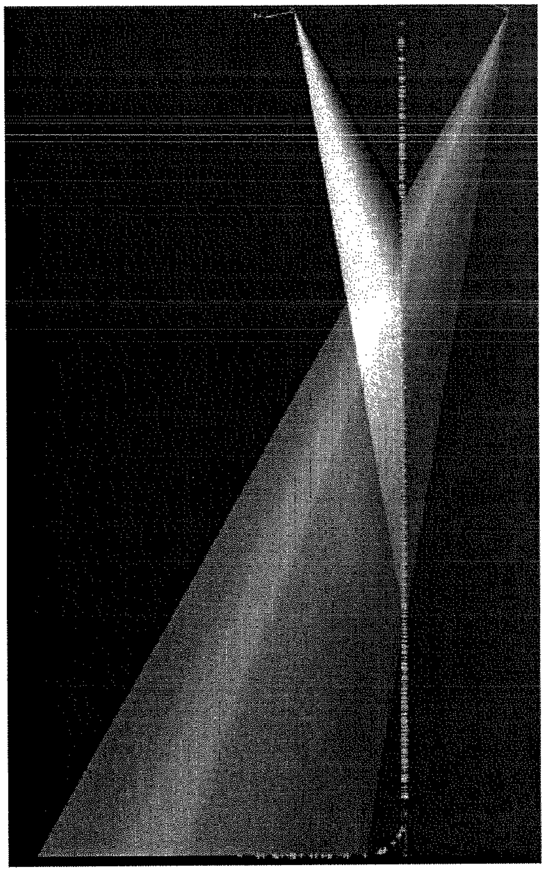
Figure 6C:
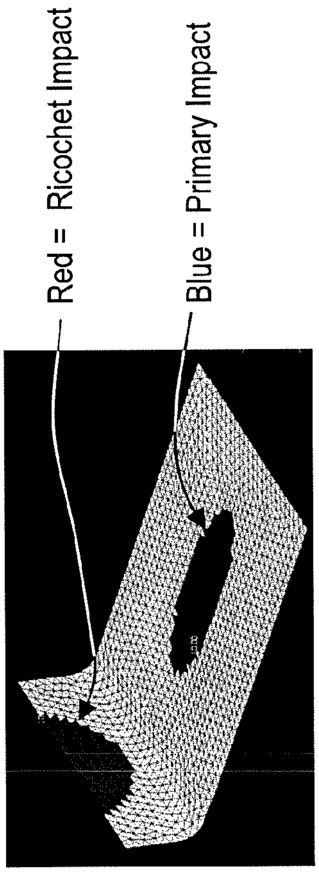
Figure 7:
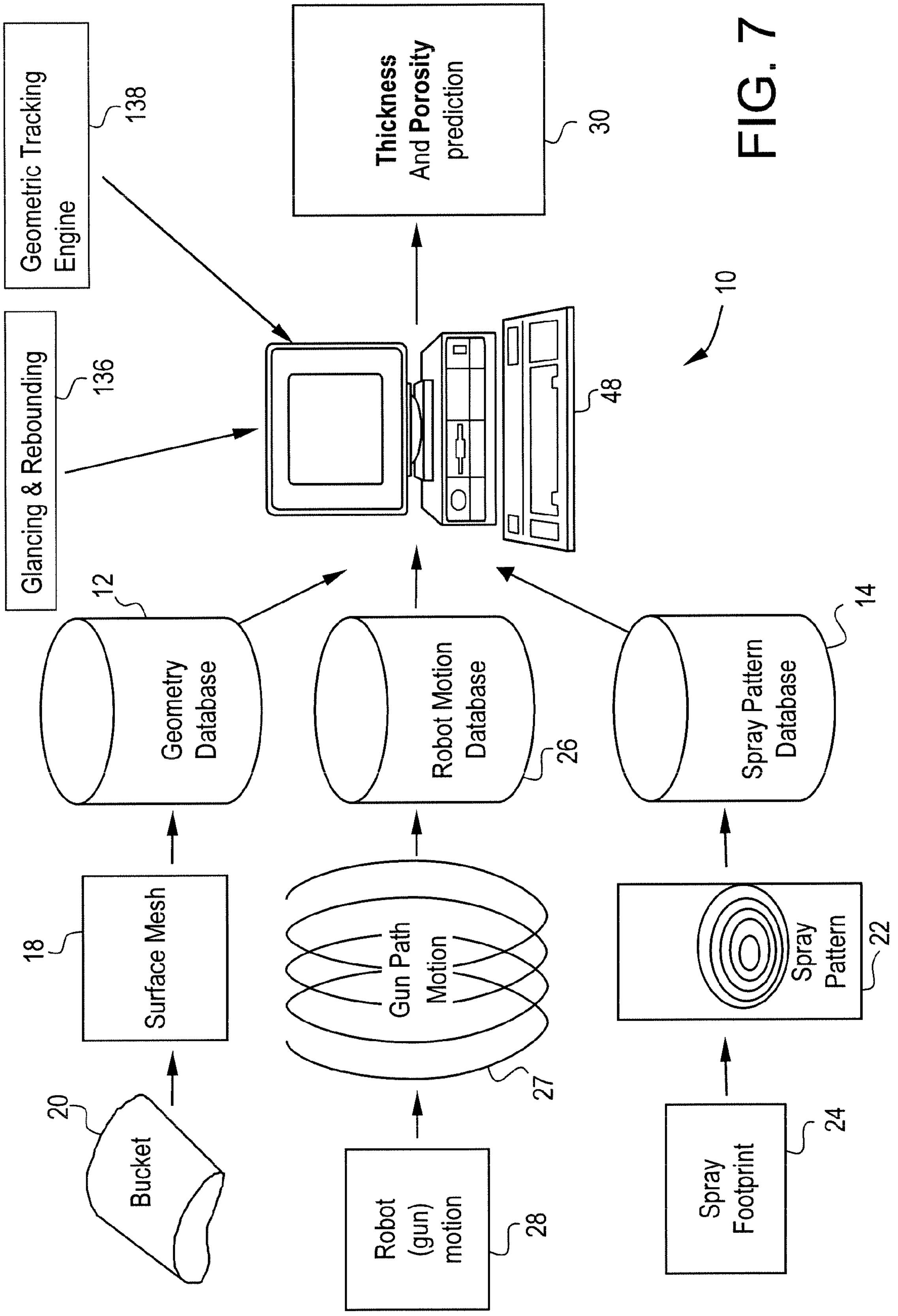
Figure 8:
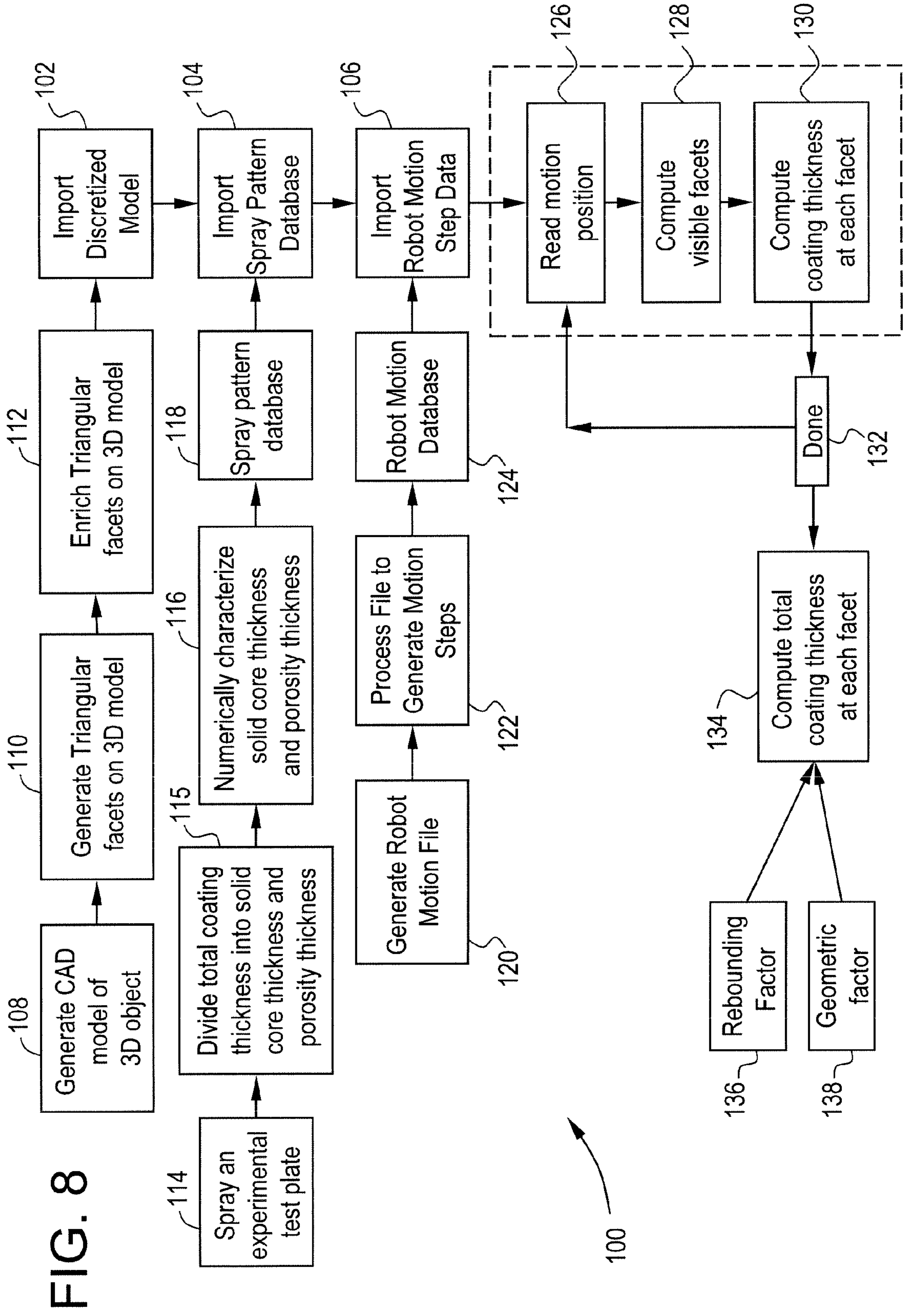
Figure 9:
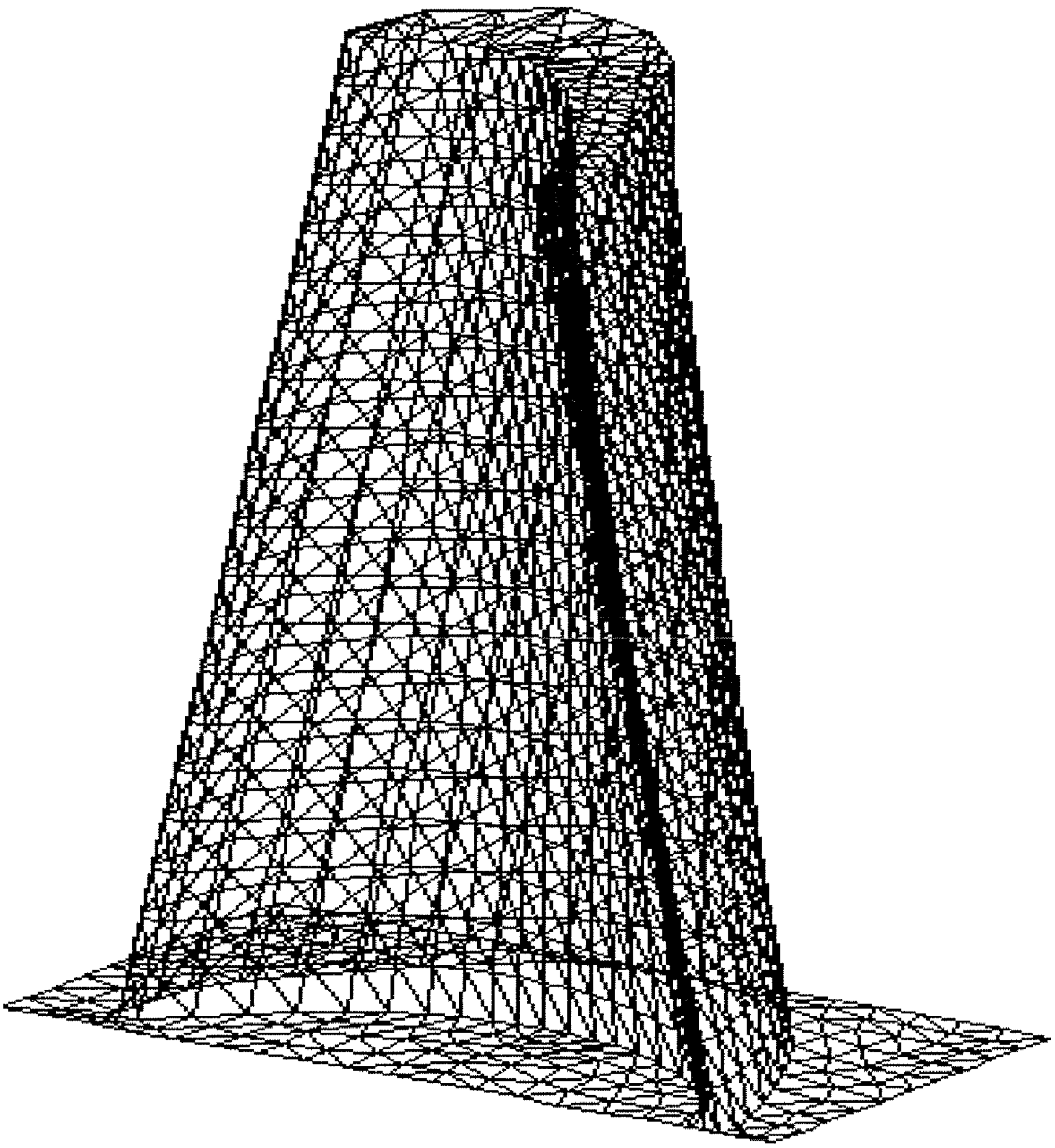
Figure 10:
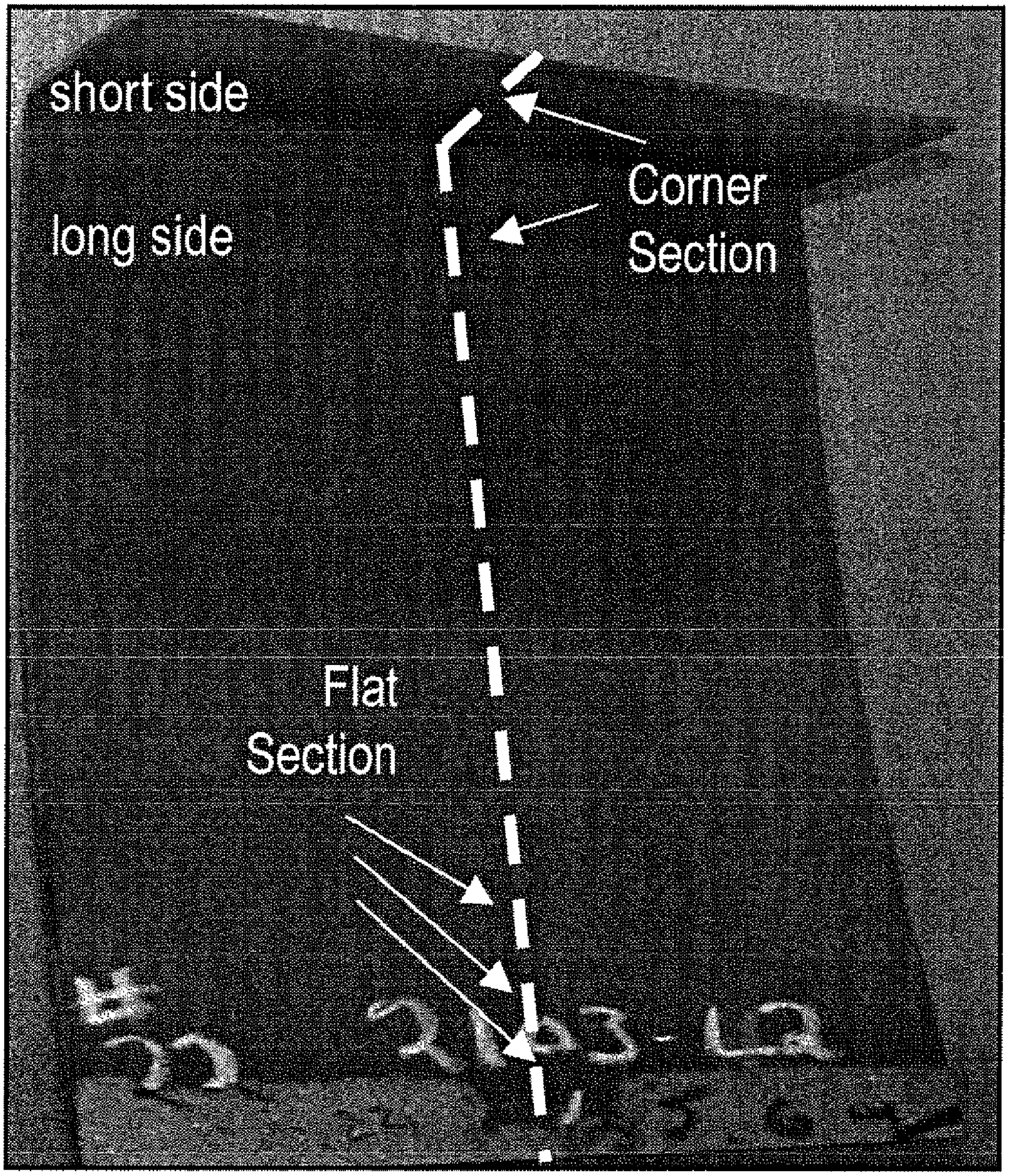
Figure 11:
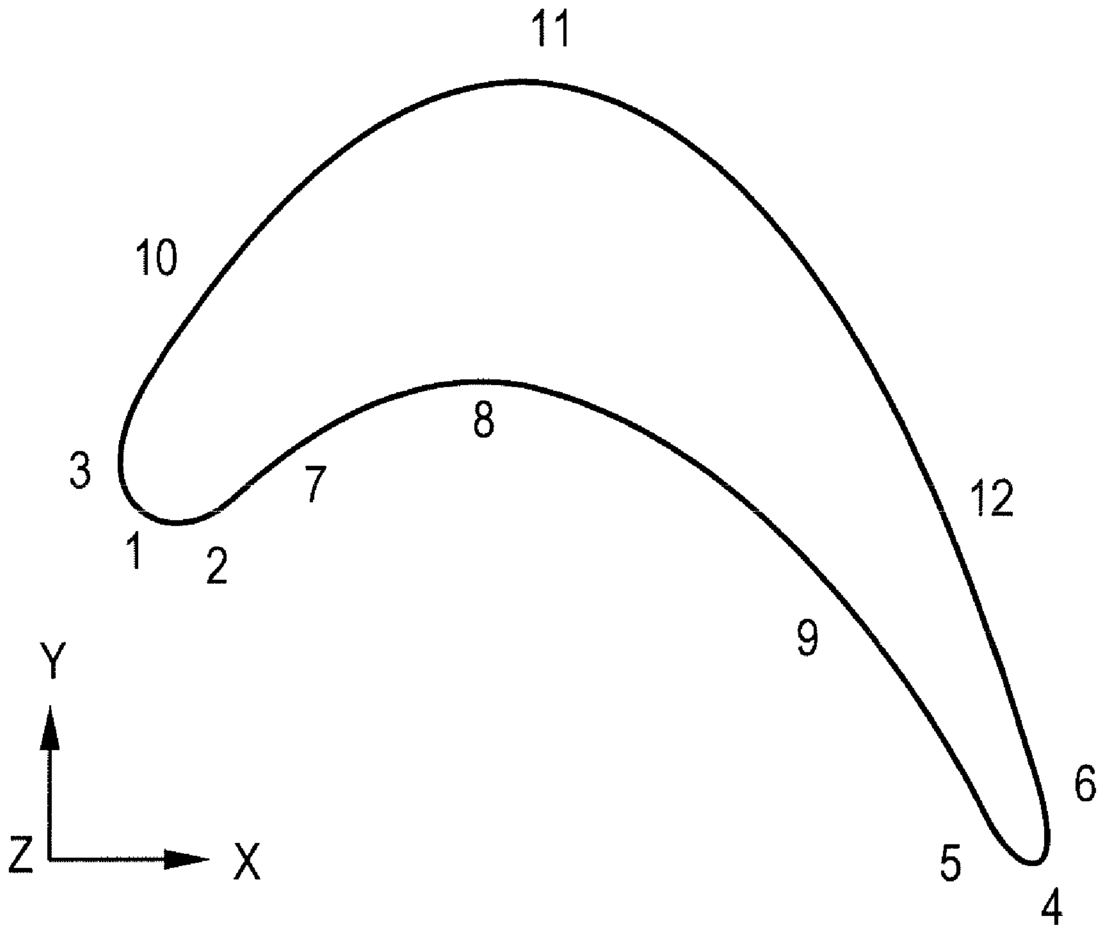
Figure 12:
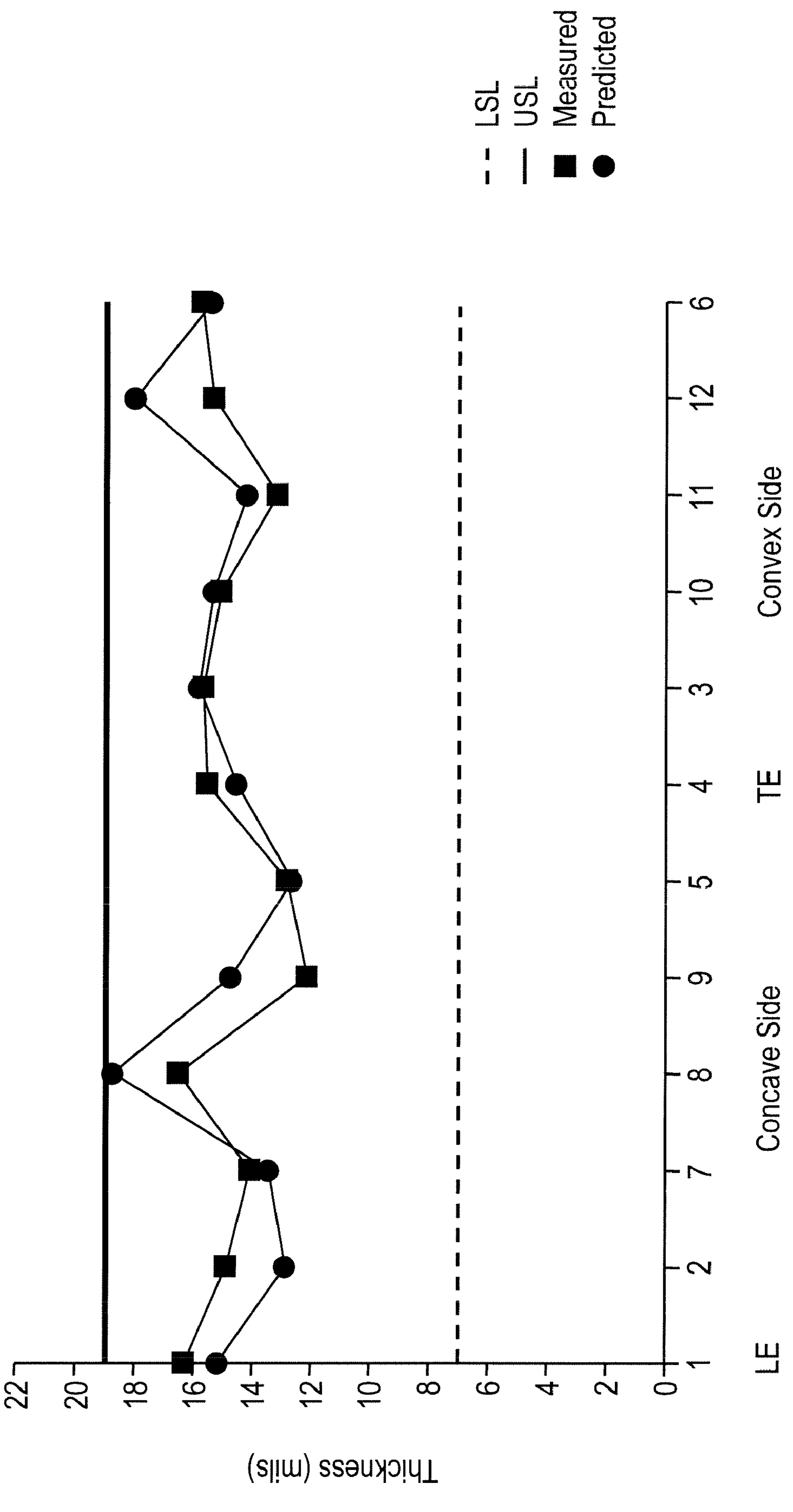
Figure 13:
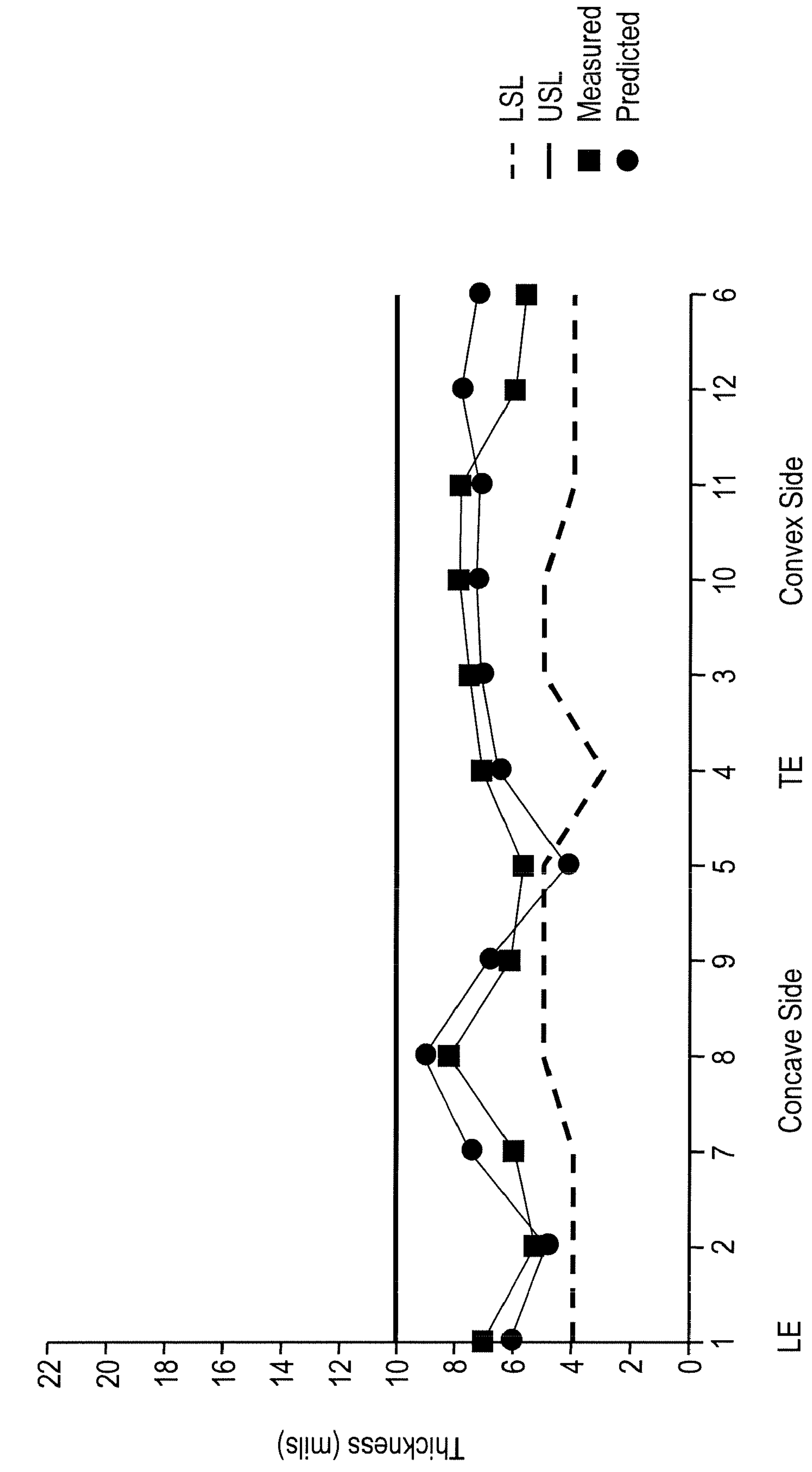
Figure 14:
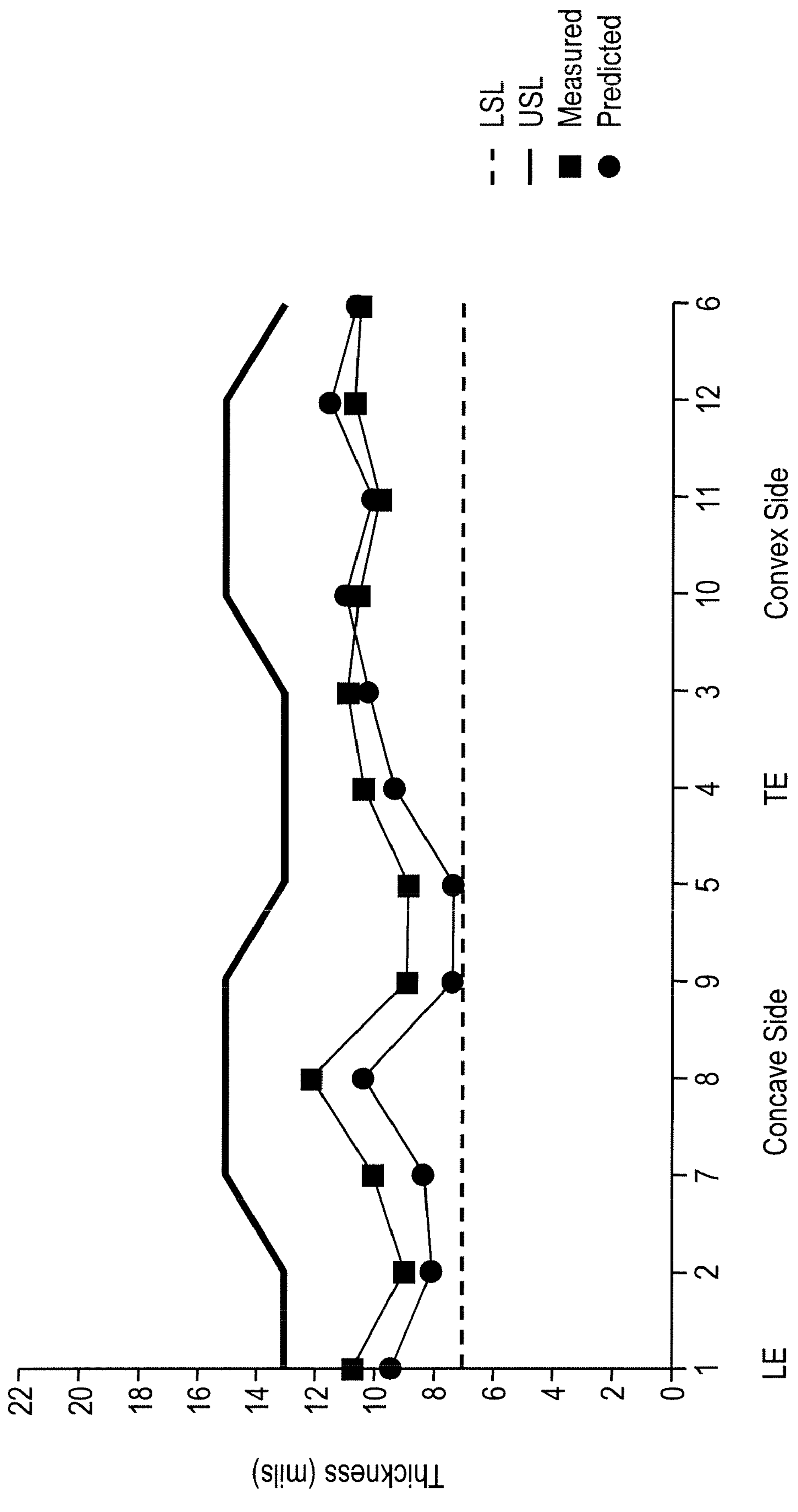

FIG. 6 depicts the effect of ricocheting. FIG. 6(*a*) depicts the spray cone on a first flat surface that has a second flat surface disposed at right angles to the first flat surface; FIG. 6(*b*) shows the ricochet cone for the same spray angle. In FIG. 6(*b*) the ricocheting spray cone is assumed to mirror the original spray cone. FIG. 6(*c*) shows the pattern on the second flat surface caused by the ricocheting particles from the first flat surface;

FIG. 7 depicts a system 10 for controlling the porosity in the coatings used in turbine buckets that comprises a geometry database 12, a spray pattern database 14 and a gun motion database 26;

FIG. 8 depicts a flow diagram 100 that is used for computing coating thickness while accounting for the void volume fraction in the coating;

FIG. 9 is a graphical representation of a the three-dimensional model 18 enveloped with a triangular finite element mesh;

FIG. 10 is a photograph showing the L-shaped plate that is subjected to coating in the Example 1;

FIG. 11 is a depiction of a cross-section of a turbine blade that was coated in the Example 2;

FIG. 12 is a graphical comparison of the predicted and measured thicknesses at selected locations on the cross-section of the turbine blade indicated in the FIG. 11;

FIG. 13 is a graphical comparison of the predicted and measured thicknesses at selected locations on the cross-section of a second turbine blade indicated in the FIG. 11; and FIG. 14 is a graphical comparison of the predicted and measured thicknesses at selected locations on the cross-section of a third turbine blade indicated in the FIG. 11.

DETAILED DESCRIPTION

It is to be noted that the terms “first,” “second,” and the like as used herein do not denote any order, quantity, or importance, but rather are used to distinguish one element from another. The terms “a” and “an” do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). It is to be noted that all ranges disclosed within this specification are inclusive and are independently combinable.

Disclosed herein is a method and a system for controlling the porosity in coatings used on the surface of turbine buckets. The method is also advantageously used for computing the thickness of the coating based upon controlling the porosity in the coating. The method can be advantageously used for reducing and minimizing the porosity in coatings used on the surface of turbine buckets. The method involves controlling the robotic spray gun operating conditions as well as the motion of the robotic spray gun. In one embodiment, the method for controlling porosity comprises utilizing an empirical equation that includes effects of core compression, the effect of the incident angle of the spray gun and the effect of the rebounding of particles and using this empirical equation to minimize the development of porosity in spray coatings applied to an object such as a turbine bucket.

In one embodiment, the system functions as a virtual spray cell where information about the various parameters involved in plasma spray coatings can be input and information regarding the quality of the coating can be obtained. The quality of the coating is generally determined by the coating thickness and the porosity of the coating. As will be seen below, the quality of the coating is dependent upon factors such as the geometry of the object to be coated, the spray pattern made by the spray gun, the robotic motion that in turn controls motion of the spray gun, the glancing and rebounding of particles after being sprayed onto the object surface and the geometric tracking effect which takes into account interactions between all or some of the aforementioned factors.

Figure 1:
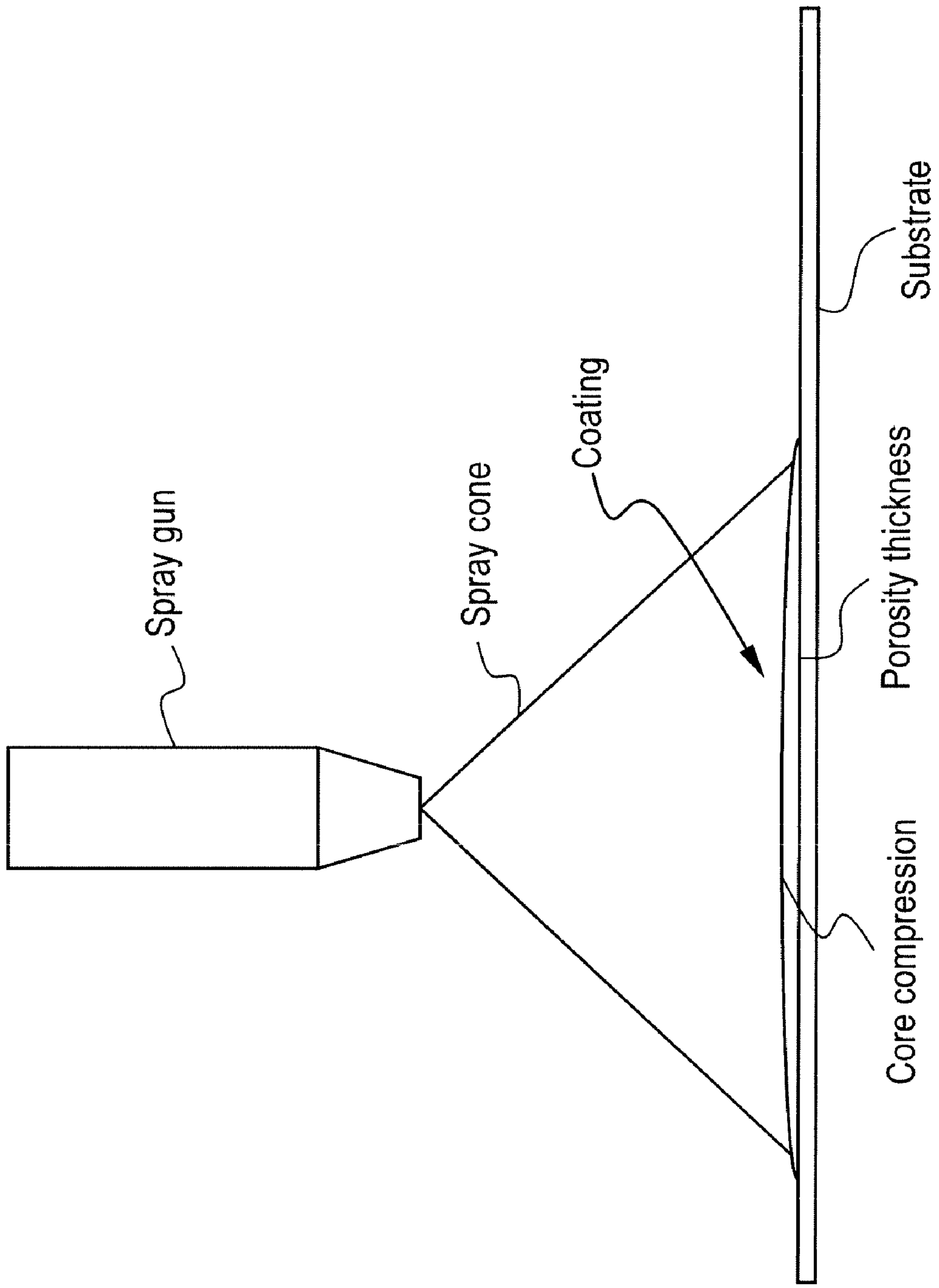

In the application of a coating from a spray gun upon a single region of a surface, a coating having a distribution of thicknesses is obtained. This coating is referred to as a spray pattern or a footprint. During the application of the coating from an exemplary plasma spray gun, the spray emanates from the spray gun in the form of a spray cone as shown in the FIG. 1. This spray cone results in a coating that has certain characteristics, which are depicted in the schematic in the FIG. 1. These characteristics are specific to the spray gun and other parameters used during the spray process such as for example, particle size, distance of the spray gun from the substrate to be coated, curvature of the substrate, or the like. As can be seen in the FIG. 1, the spray pattern obtained from the spray gun comprises a central region that is fully dense and greater in thickness that the outer region. This central region is generally devoid of porosity and is referred to as the core compression region or the void compression region, while the outer ring of the coating that corresponds to the periphery of the spray cone is generally thinner than the central region. This outer ring is also porous. This porosity is believed to be due to the presence of unmelted or partially melted spray particles. The region at the outer ring is also termed the porosity thickness region, since the porosity in the coating contributes to coating thickness.

Figure 2:
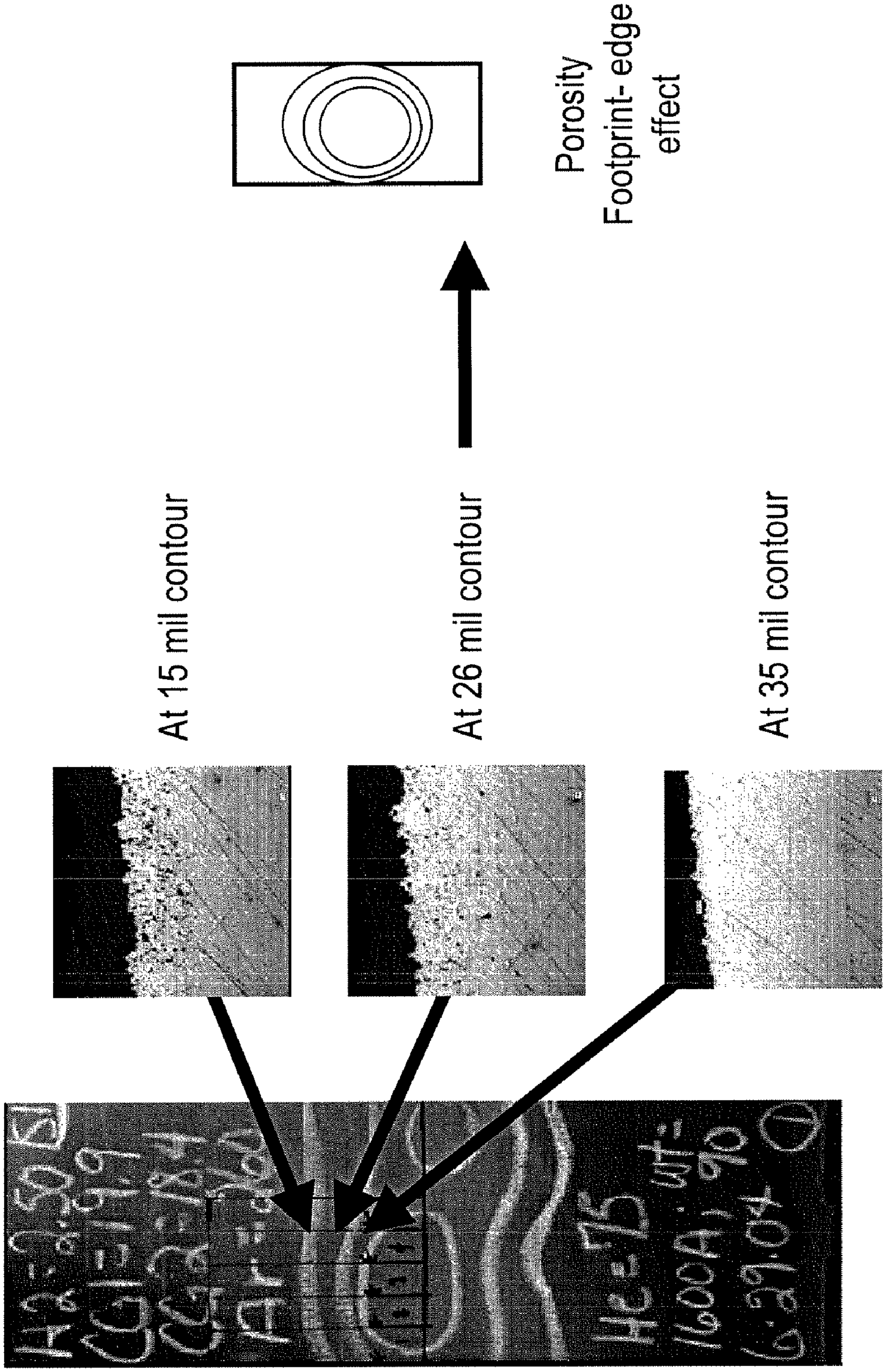
FIG. 2 is a photograph showing a footprint along with the respective thicknesses at the center region and the outer region of the footprint.
Figure 3:
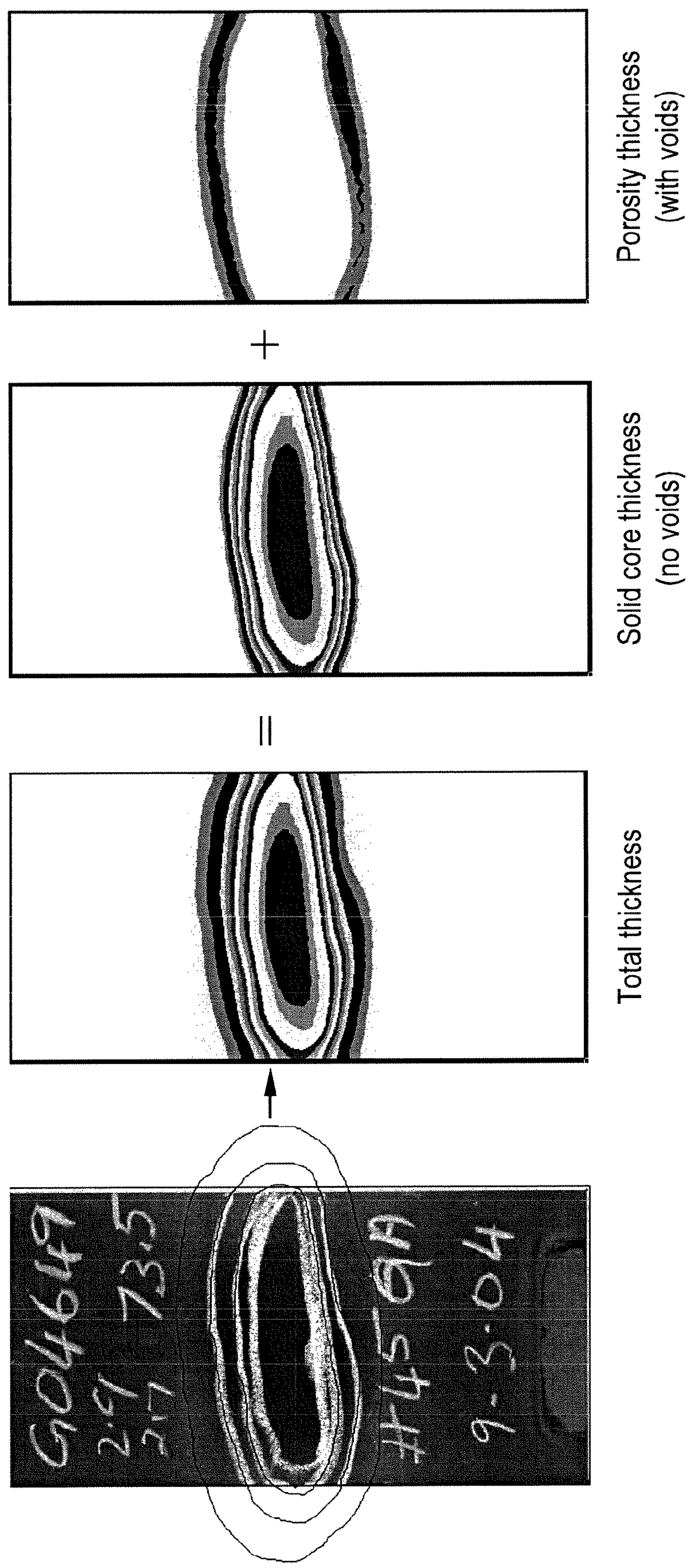
FIG. 3 is a depiction how the thickness in a given footprint is a function of the solid core thickness as well as the porosity thickness.
Figure 4:
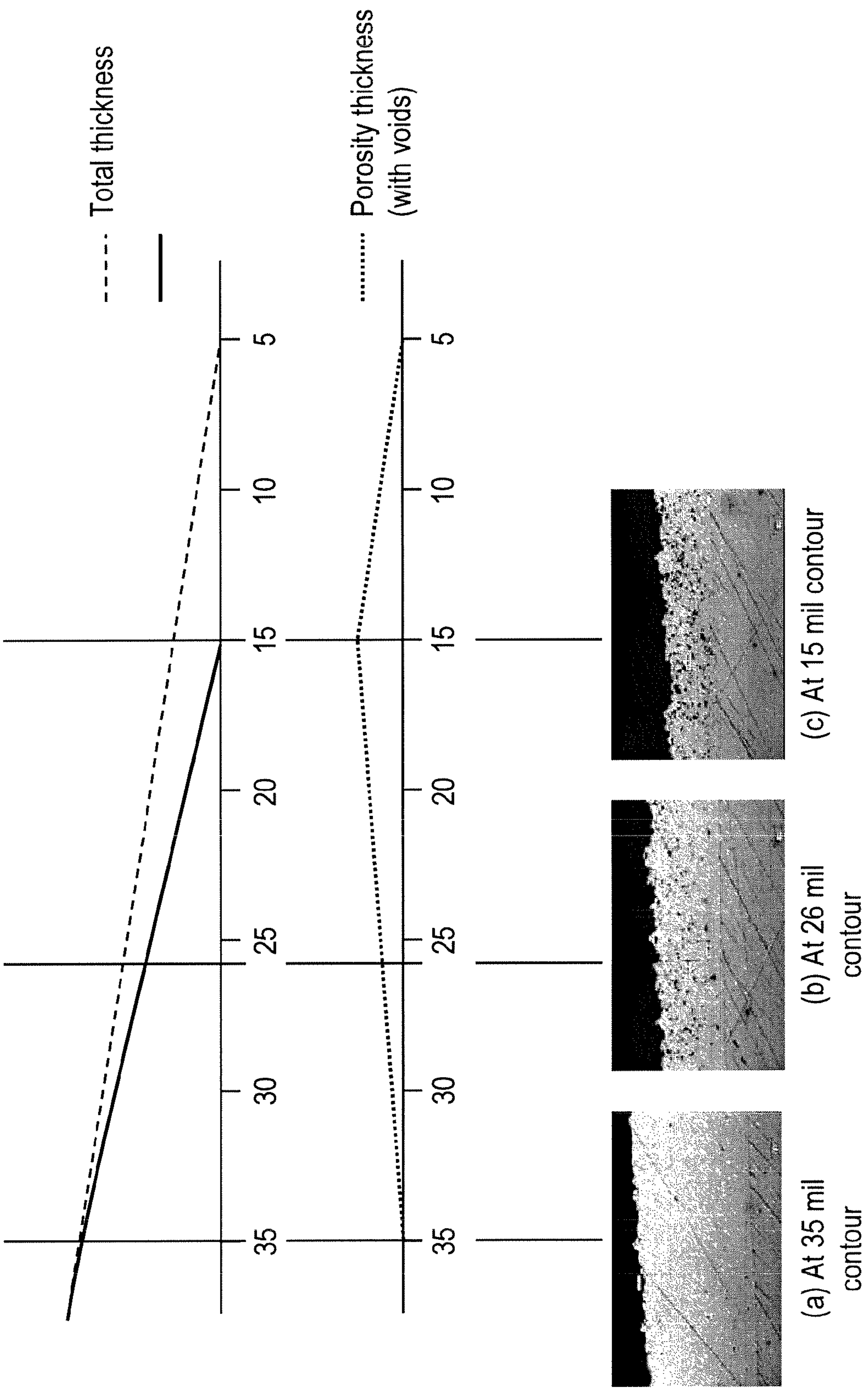
FIG. 4 shows the photographs of FIG. 2 along with the corresponding graphical representations of the respective contributions to thickness.

This contribution to total thickness from the solid core thickness and the porosity thickness is demonstrated in an exemplary footprint shown in the photographs in FIGS. 2, 3 and 4 respectively. FIG. 2 shows a footprint along with the respective thicknesses at the center region and the outer region of the footprint. From FIG. 2 it may be seen that at the center of the footprint the thickness is 35 mils, while as one proceeds outwards from the center, the coating thickness is reduced to about 15 mils.

The coating thickness is measured using a micrometer, or the like, to determine regions of different thickness, which regions are delineated with chalk markings, or the like as shown in the FIG. 3. The footprint is then digitized for archiving the image and for further analysis. As can be seen in the FIG. 3, the spray pattern is characterized by the thickness of the coating. The spray pattern is analyzed for the effect of factors such as the coating thickness, size and thickness of the porous ring, and the size of the solid core. Based upon the thickness, the coating is divided into two portions, a first portion that comprises the solid core thickness and a second portion that comprises the porosity thickness. The region representing the porosity thickness is the outer ring of the spray cone where coating particles generally remain unmelted or partially melted. The separation of the spray pattern into two regions of thickness can be used to provide information on the void volume fraction compression.

FIG. 4 shows the photographs of FIG. 2 along with the corresponding graphical representations of the respective contributions to thickness. As may be seen in these photographs and the accompanying graphical representation, the coating corresponding to the central region having a thickness of 35 mils (1 mil=$10^{-3}$ inch) shows no porosity. This indicates that at the central region there is a core compression effect that facilitates the elimination of voids. However, at values of coating thicknesses less than 35 mils, such as in the outer regions of the footprint, there is a contribution to thickness from the porosity. As may be seen in the graphical representation in the FIG. 4, this contribution from porosity increases as the coating thickness is reduced from 35 mils to 15 mils. At a coating thickness of less than 15 mils, the porosity thickness and hence the void content once again begins to decrease.

Figure 5:
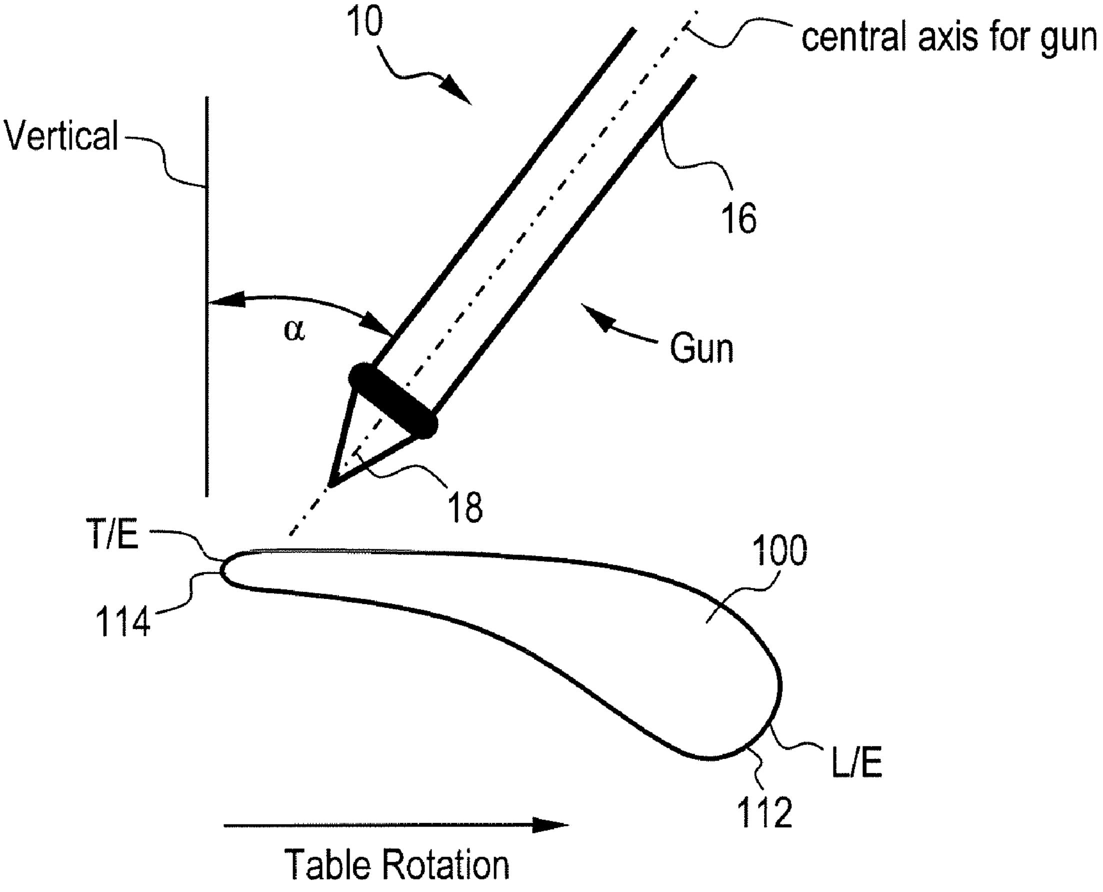
FIG. 5 is the incident angle at between the central axis of the spray gun and a normal to the surface of the substrate being coated. When a flat plate is being coated in the stationary mode, the incident angle $\alpha$ is 0 degrees.

Without being limited to theory, it has been determined that the void volume fraction is dependent upon the core compression, the incident angle between the spray gun and the substrate to be coated and the ricocheting or rebounding of spray particles from the substrate. The incident angle $\alpha$ is shown in the FIG. 5 is the angle between the central axis of the spray gun and a normal to the surface of the substrate being coated. The vertical should be the outward normal at a specific point (e.g., tangent to the curve) on the bucket surface. When a flat plate is being sprayed in the stationary mode, the incident angle $\alpha$ is 0 degrees.

The ricocheting of particles from the substrate also contributes to porosity and hence to the void volume fraction. As may be seen in the FIG. 5, the ricocheting causes particles to be deflected from the turbine blade and to be deposited onto the adjoining platform surface. Alternatively particles that are deflected from the platform surface are deposited on the turbine blade. This ricocheting of particles causes an increase in porosity.

In order to model the porosity caused by ricocheting, it is assumed that rebounding occurs only at the porous ring and not in the solid core. The ricochet model tracks only primary rebounding. The ricochet pattern is performed on a facet-by-facet basis. It is further assumed that a percentage of the rebounding particles stick to the ricochet surface. An individual ricochet from a facet may generate multiple ricochet facets.

The effect of ricocheting is shown in the FIG. 6. FIG. 6(*a*) depicts the spray cone on a first flat surface that has a second flat surface disposed at right angles to the first flat surface, while FIG. 6(*b*) shows the ricochet cone for the same spray angle. In FIG. 6(*b*) the ricocheting spray cone is assumed to mirror the original spray cone. The pattern on the second flat surface caused by the ricocheting particles from the first flat surface is shown in the FIG. 6(*c*). For purposes of modeling the ricocheting, the pattern created on the second flat surface is assumed to be similar to that caused by a spray cone that can be represented by the mirror image of the actual spray cone.

On a turbine bucket that comprises convex and concave surfaces, the ricocheting effect may be split into a glancing effect produced by ricocheting from the convex surface and a rebounding effect produced by ricocheting from the concave surface. On a convex surface, where the part curves away from the spray gun, a "glancing" factor is used to account for those particles that would stick to a flat surface but will scatter off the curved surface; this factor may be a function of the relative angle between the spray particles and the surface normal. The use of such a glancing factor would reduce the predicted thickness distribution over an actual part.

On a concave surface, where the part curves up towards the spray gun, a "rebounding" factor may be needed to account for those particles that would scatter off one part of the curved surface but are captured by another part after bouncing inside the cup-like surface. The use of such a rebounding factor would increase the predicted thickness distribution over an actual part.

The results obtained from the footprint can be used to generate an empirical equation that can be used to predict the void volume fraction. As shown below in the equation (I), the empirical equation links the void volume fraction to the core compression, the effect of incident angle and to the effect of rebounding particles, $$VVF = IVVF * \left\{ A * \left(\frac{PT}{PT + CT}\right)^{k} + B * (\sin(\alpha))^{m} + C * \left(\frac{RT}{RT + PT}\right)^{n} \right\} \quad \text{(I)}$$

where VVF=void volume fraction, IVVF=initial void volume fraction, CT=solid core thickness at any location on the surface of the turbine bucket, PT=porous ring thickness at the same location and RT=thickness of ricochet layer or ricochet thickness, A, B, C, k, m, n are constants whose values are determined based upon experimental data, and $\alpha$ is the incident angle between gun and a perpendicular to a tangent taken at the surface. The solid core thickness CT, the porous ring thickness PT and the ricochet thickness RT represent the thickness of the coating measured from the surface of the turbine object.

In an exemplary embodiment, the constants A, B, and C can have values of about 0 to about 1. In another exemplary embodiment, the constants k, m and n can also have values of about 0 to about 1 respectively.

In the equation (I) above, the first term on the right hand side of the equation having the constant A represents the core compression, the second term on the right hand side of the equation having the constant B represents the contribution to porosity due to the angle of incidence while the last term having the constant C represents the contribution to porosity due to ricocheting. In one embodiment, a computer algorithm may be executed to control the porosity during the coating of the turbine buckets using the equation (I).

With reference now to the FIG. 7, a system 10 for controlling the porosity in the coatings used in turbine buckets comprises a geometry database 12, a spray pattern database 14 and a gun motion database 26. The geometry database 12, the spray pattern database 14 and the gun motion database 26 are in communication with a computer 48 that provides information about coating thickness and porosity. In one embodiment, the information received from the computer 48 can be advantageously used for predicting coating characteristics such as thickness and porosity on turbine buckets having differing geometries. In another embodiment, the information received from the computer 48 can be advantageously used for optimizing the porosity of a coating applied to a turbine bucket. As can be seen in the FIG. 7, in addition to information received from the respective databases, glancing and rebounding information 136 and geometric tracking information 138 through the most sophisticated ricochet computation are transmitted to the computer to facilitate processing of information that can be used to generate predictive information or to control coating porosity and/or coating thickness on an object such as a turbine bucket.

The geometry database 12 generally contains information obtained from a computer-aided design (CAD) model of a three-dimensional object such as a turbine bucket that is to be coated. With reference now to the FIG. 8, a flow diagram 100 for importing a model of the three-dimensional object 102 comprises generating a CAD model of a three-dimensional object 108, generating triangular facets, or the like, on the three-dimensional model 110, and enriching the triangular facets 112. In one embodiment, triangular facets are used and can be generated by many commercially available software packages. This methodology, however, can be applied with other types of facets as well.

With reference now to the FIGS. 7 and 8, a three-dimensional model 108 of an object 20 to be coated is generated, imported or loaded in a standard CAD design program, for example UNIGRAPHICS®, PATRAN®, I-DEAS®, PROENGINEER®, or the like, within computer 48. The generated model 12 comprises surfaces or solids that define the object 20 of interest.

Next, at block 110 of flow chart 100 in the FIG. 8, the three-dimensional model 108 is enveloped with a triangular finite element mesh or the like as shown in the FIG. 9. A finite element or computer graphics software capable of decomposing a 3D surface into a mesh of triangular or other geometrically shaped elements, or facets, can be used for generating this mesh. Accordingly, the object 20 is defined as a discretized geometric representation comprising triangular shaped facets on the part surface. The smaller the size of each facet, the more accurate the predicted thickness distribution will be.

With reference again to the FIGS. 7 and 8, at block 112, the facets disposed upon the three-dimensional model 108 are enriched. The enrichment process uses mathematical methods for computing the area, centroid location, facet normals, and the like. The neighboring facet data is computed by determining the common edges and nodes among the facets, and then finding the adjacent facets. Finally, the discretized CAD model is imported to computer 48 at block 102.

Importing the spray pattern data at block 104 generally comprises spraying experimental test plates at block 114 to develop a spray pattern which is sometimes referred to as a footprint, numerically characterizing these spray patterns at block 116 and generating a spray pattern database at block 118 comprising a plurality of numerically characterized spray pattern files.

First, at block 114 a series of experimental test plates are sprayed. Flat plates are preheated and held stationary while being sprayed with a stationary plasma gun for a fixed period of time.

With reference now once again to the FIGS. 7 and 8, at block 116, each spray pattern 22 (that is divided into two portions as mentioned above) is numerically characterized. The data for each spray pattern 22 comprises a series of $n^{th}$ degree polynomials representing the coating thickness at the two portions on the spray plate, the cone angle of the entire spray pattern 22 and the height at which it was characterized. The cone angle of the spray pattern is defined as the angle at the apex of the cone of spray emanating from the spray gun. Any other type of mathematical representation of the thickness map for the spray pattern 22 may, however, be incorporated into the geometric tracking module.

Next, at block 118 (see FIG. 8), a spray pattern database 14 (see FIG. 7) is generated comprising each of the plurality of experimental test plates with numerically characterized spray patterns 22. The empirical approach of characterizing the experimental spray data was developed to bypass modeling the complicated plasma physics, fluid flow, and heat transfer/melting phenomenon that occurs between the plasma and the particles. It is desirable, however, to experimentally generate a database of these spray patterns 22 as a function of the gun conditions (which conditions include the gun model, carrier gas flow rate, gas mixture, current, and powder feed rate) and the powder properties (which properties include the particle size, size distribution, shape, and material). Finally, at block 104, the spray pattern file 22 for the appropriate spray conditions is selected and imported to computer 48 (FIG. 7).

Importing the robot motion step data at block 106 (FIG. 8) comprises generating a robot motion file at block 120, processing the file to generate motion steps at block 122, and generating a robot motion database at block 124. The robot motion step data provides information about the gun position and orientation since the robot controls motion of the gun from which the coating is sprayed. A robot motion step file is defined as a series of discrete positions along the motion path that a spray robot follows relative to a stationary geometric object, as well as the time spent in each position (dwell time) and the three-dimensional orientation of the spray nozzle (a vector) relative to the object. The robot motion also contains information that combines object rotation (e.g., turbine bucket rotation) and gun translation via a coordinate transformation system. The robot motion database at block 124 provides three dimensional time dependent information about the gun position and orientation.

With reference once again to the FIGS. 7 and 8, at block 120, a plurality of robot motion files 27 (FIG. 7) are generated. In general, robot spray gun 28 (see FIG. 7) programming techniques provide this data in a variety of forms. The data in a robot motion path file 27 is represented in terms of the relative motion of the plasma gun and the geometric object (e.g., the turbine bucket). The object can be either stationary or revolving, for example, while the plasma gun may translate, rotate, or perform a combination of these motions relative to the object. The robot motion file 27 defines the number of translations, rotations, distances, angles of spray, and the like, needed to define the relative motion of the plasma gun and the geometric object (FIG. 8).

Next, at block 122, the robot motion path file 27 (FIG. 7) is processed to generate the motion step file. The data from the robot motion file 27 is translated into a file that comprises the geometric x-y-z coordinates of the plasma spray gun relative to a stationary object, a dwell time at each position, and a vector defining the orientation of the spray gun relative to the object. As a robot produces a continuous motion path, the smaller the time increment utilized, the more accurate the coating thickness prediction will be. Each robot motion file is adjusted for respective spray processes and object geometries.

At block 124 (FIG. 8), a robot motion database 26 (see FIG. 7) is generated containing each respective robot motion step file. As can be seen in the FIG. 8, at block 106, a particular robot motion step file 27 is selected and imported. In blocks 126, 128, and 130 (FIG. 8), a geometric tracking module computes the effect of the spray on the object at each position in the motion step file. At block 126, each motion position is read, one at a time. This data includes the gun position, orientation, and dwell time.

At block 128, the geometric tracking module determines which portions of the object geometry 18 (i.e. which facets) are visible. This is accomplished by first determining which facets fall within the cone of the spray pattern 22. This is done by collecting all of the facets whose centroids are within the cone of the spray pattern 22 at the current gun position. These facets are then subjected to a shadowing test to exclude all facets occluded by facets nearer to the spray gun nozzle (i.e. the module operates on the line-of-sight principle). The shadowed facets are determined by using the barycentric coordinates of one facet relative to another. The visible facets at this gun position are those facets that remain after this test.

Next, at block 130, the geometric tracking module computes a coating thickness at each visible facet based on the facet's position within the spray cone, the characterization polynomials for the spray pattern definition and the distance between the facet and spray gun (gun to substrate distance). This coupling between the geometric tracking module and the spray pattern 22 accounts for the non-flat surfaces of the object. The geometric tracking module also scales the coating thickness at each visible facet by the impact angle of the spray on the facet. For example, if the spray angle is perpendicular to the object geometry at a particular facet, then the full amount of the coating is applied there. However, if the spray angle is such that the facet is nearly parallel to the spray, then very little of the coating is applied.

At block 132 a determination is made as to whether the computations are complete or not. If the entire motion step file has been processed, then the method advances to block 134, otherwise, it returns to block 126 to process the next motion step.

At block 134, the coating thickness resulting from database computations based upon the geometry of the object, database computations based upon the motion of the robot (spray gun) and database computations based upon the spray footprint are used to determine coating thickness values. The coating thickness for each facet at each spray position is added to determine the predicted coating thickness for each facet on the part.

In one embodiment of this invention, two additional empirical factors are utilized generally sub routines within the base algorithm. Because the spray patterns are generated on flat (or "neutral") surfaces, these factors may be used to account for the curvature effect in the real 3-D objects.

On a convex surface, where the part curves away from the spray gun, a "glancing" factor at block 136 may be needed to account for those particles that would stick to a flat surface but will scatter off the curved surface; this factor may be a function of the relative angle between the spray particles and the surface normal. The use of such a glancing factor would reduce the predicted thickness distribution over an actual part.

On a concave surface, where the part curves up towards the spray gun, a "rebounding" factor at block 138 may be needed to account for those particles that would scatter off one part of the curved surface but are captured by another part after bouncing inside the cup-like surface. The use of such a rebounding factor would increase the predicted thickness distribution over an actual part. This rebounding effect will be directly calculated by the ricochet simulation embedded in the geometric module.

The glancing factor would be determined experimentally based on thickness comparisons between the experiments and model predictions.

The use of a spray pattern or footprint on a flat plate is advantageous in that it avoids the use of expensive turbine buckets for making these measurements. Making such measurements on a turbine bucket requires buckets to be cut up, which is expensive and time consuming. In addition, if the coating on the control bucket was not within a desired specification, stripping and recoating of the entire set of buckets is generally to be carried out, which is also expensive and time consuming.

The methodology disclosed here can be used to estimate the powder efficiency associated with any spray motion path and any particular spray pattern definition (i.e., any particular set of processing conditions). To do this, an additional triangular finite element mesh is constructed to completely surround the existing object geometry. As the object geometry is sprayed, any parts of the spray cone that do not intersect the object will intersect this surrounding geometry. By calculating the powder captured by the object and by the surrounding geometry, an estimate of the percentage of powder striking the object can be generated. This calculation is quite valuable in designing the spray patterns for different object geometries—as the object geometry changes, the pattern can be adjusted to maximize the powder efficiency. Alternatively, instead of constructing the additional finite element mesh to capture the wasted powder, it is possible to integrate the area of the spray pattern over time, and to subtract the accumulated spray on the object geometry to compute the wasted powder.

The following examples, which are meant to be exemplary, not limiting, illustrate methods of controlling coating thickness on some plates and blades using various embodiments of the model described herein.

EXAMPLES

Example 1

This example was performed to demonstrate the ability of the system to use the empirical equation for predictive purposes. In this example, a flat plate depicted in the FIG. 10 having an L-shape and comprising a first flat surface and a second flat surface disposed at right angles to the first flat surface was coated in accordance with the empirical equation (I). For purposes of this example, as may be seen in the photomicrograph in the FIG. 10, the first flat surface has been referred to as the short side, while the second flat surface has been referred to as the long side. The empirical equation (I) was used to predict the void volume fraction, which was then measured. Both values are shown in the Table 1 below. The coating was applied by a Vacuum Plasma Spray (VPS) process.

For purposes of the calculation the initial void volume fraction (IVVF) was assumed to be 10%. From the Table 1, the calibration of the coefficients A, B and C was conducted by running experiments based upon a design of experiments (DOE) and a Microsoft EXCEL® solver. The comparison between the predicted and the measured porosity levels is shown in the Table 2 for 3 L-shaped plates identified as sample #'s 19, 21 and 22 respectively.

TABLE 1

| | RunOrder | PT | RT | CT | Alpha | IVVF | A | B | C | R | Calc-VVF | Meas. | Diff* *2 |
|---|---|---|---|---|---|---|---|---|---|---|---|---|---|
| SHORT | 3 | 0.05324 | 0.04187 | 0.21326 | 84.31 | 10 | 0.51 | 0.16 | 0.78 | 20 | 6.03 | 6.03 | 4.49E−13 |
| SHORT | 4 | 0.05324 | 0.04187 | 0.21326 | 84.31 | 10 | 0.28 | 0.19 | 0.81 | 20 | 6.03 | 6.03 | 2.18E−13 |
| SHORT | 7 | 0.05324 | 0.04187 | 0.21326 | 84.31 | 10 | 0.29 | 0.29 | 0.58 | 20 | 6.03 | 6.03 | 2.15E−13 |
| SHORT | 8 | 0.05324 | 0.04187 | 0.21326 | 84.31 | 10 | 0.54 | 0.24 | 0.58 | 20 | 6.03 | 6.03 | 2.32E−13 |
| LONG | 3 | 0.58918 | 0.00000 | 3.61547 | 4.54 | 10 | 0.31 | 0.00 | 0.75 | 20 | 0.44 | 0.44 | 2.14E−14 |
| LONG | 4 | 0.58918 | 0.00000 | 3.61547 | 4.54 | 10 | 0.28 | 0.07 | 0.75 | 20 | 0.44 | 0.44 | 5.28E−16 |
| LONG | 7 | 0.58918 | 0.00000 | 3.61547 | 4.54 | 10 | 0.26 | 0.10 | 0.50 | 20 | 0.44 | 0.44 | 1.16E−14 |
| LONG | 8 | 0.58918 | 0.00000 | 3.61547 | 4.54 | 10 | 0.31 | 0.00 | 0.50 | 20 | 0.44 | 0.44 | 5.27E−16 |
| FLAT | 3 | 0.51085 | 0.00000 | 1.91204 | 5.04 | 10 | 0.56 | 0.12 | 0.75 | 20 | 1.28 | 1.28 | 1.86E−13 |
| FLAT | 4 | 0.51085 | 0.00000 | 1.91204 | 5.04 | 10 | 0.54 | 0.17 | 0.75 | 20 | 1.28 | 1.28 | 1E−14 |
| FLAT | 7 | 0.51085 | 0.00000 | 1.91204 | 5.04 | 10 | 0.52 | 0.21 | 0.50 | 20 | 1.28 | 1.28 | 1.24E−14 |
| FLAT | 8 | 0.51085 | 0.00000 | 1.91204 | 5.04 | 10 | 0.57 | 0.08 | 0.50 | 20 | 1.28 | 1.28 | 1.78E−13 |
| | | | | | | | 0.41 | 0.14 | 0.65 | | | | 1.53E−12 |

TABLE 2

| | Measurement (22) | Prediction (22) | Measurement (21) | Prediction (21) | Measurement (19) | Prediction (19) |
|---|---|---|---|---|---|---|
| Short Side | 6.0 | 4.2 | 3.0 | 4.3 | 3.1 | 3.9 |
| Long Side | 0.4 | 0.6 | 1.1 | 2.0 | 1.9 | 2.9 |
| Flat Section | 1.3 | 1.1 | 1.1 | 1.1 | 1.2 | 1.2 |

Example 2

This example demonstrates the use of the system 10 and the empirical equation (I) for coating a turbine bucket. In this example the coating thickness distributions predicted by the methodology disclosed herein have been compared with coatings on turbine buckets that were produced by the VPS process. In this example, a representative spray motion file that shows the motion path of the spray gun (not shown) relative to the stationary object geometry was used. This motion path was broken down into approximately 1900 discrete positions. A representative spray pattern represented by an $n^{th}$-degree polynomial was used. A representative finite element mesh of the object geometry, which is the surface of the turbine bucket showing the triangular facets needed by the geometric tracking module, is contained in FIG. 9. A section of the bucket is shown in the FIG. 11. Based on the FIG. 11, the locations on the convex side of the bucket are 3, 10, 11, 12, and 6, while the locations on the concave side are 2, 7, 8, 9, and 5. The leading edge is at locations 3, 1, and 2, while the trailing edge locations are 5, 4, and 6.

FIGS. 12-14 depict a comparison of the predicted and measured thicknesses at the locations shown in the FIG. 11. The comparison between the model (prediction) and experiment is very good at all locations. Although the test case presented in this disclosure uses the vacuum plasma spray (VPS) process to deposit the powder, the methodology is not limited to this spray process; it can be translated for the thermal barrier coating (TBC) process, the high-velocity oxygen fuel (HVOF) process, and other spray coating processes as well.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A spray coating process for a robotic spray gun assembly comprising:

importing a discretized model of an object geometry to be coated;

importing a numerically characterized spray pattern file;

importing a robot motion file comprising a plurality of motion positions, dwell times and orientations defining a spray direction of the robotic spray gun;

reading each motion position within the motion file;

determining which portions of the object geometry are visible at each motion position;

computing a void volume fraction at each visible portion of the object geometry based on core compression, incident angle and ricocheting of the spray for each motion position; and calculating total coating thickness on portions of the object geometry for the complete motion step.

2. The spray coating process of claim 1, wherein the computing of the void volume fraction at each visible portion of the object geometry is accomplished by using the empirical equation (I)

$$VVF = IVVF * \left\{ A * \left( \frac{PT}{PT + CT} \right)^k + B * (\sin(\alpha))^m + C * \left( \frac{RT}{RT + PT} \right)^n \right\} \quad (I)$$

where VVF=void volume fraction, IVVF=initial void volume fraction, CT represents a solid core thickness at any location on the surface of an object, PT represents a porous ring thickness at the same location, RT represents a ricochet thickness at the same location, A, B, C, k, m, n are constants, and $\alpha$ is the incident angle between the robotic spray gun and a perpendicular to a tangent taken at the surface.

3. The spray coating process of claim 2, wherein the constants A, B, C, k, l, or n each have a value of up to about 1.

4. The spray coating process of claim 1, wherein the importing a discretized model of an object geometry to be coated comprises creating a three-dimensional model of an object to be coated; enveloping the three-dimensional model with a finite element mesh having a plurality of facets; and enriching the plurality of facets with additional mathematical identifiers.

5. The spray coating process of claim 1, wherein the step of importing spray pattern file comprises spraying a plurality of test plates to identify respective spray gun pattern distribution characteristics of respective spray patterns; numerically characterizing each respective spray pattern; and generating a spray pattern database comprising the plurality of numerically characterized spray patterns.

6. The spray coating process of claim 1, wherein the step of importing a motion step file comprising a plurality of motion positions, dwell times and orientations, comprises generating a plurality of robot motion files; translating each respective motion file into x-y-z coordinates of the spray gun, a dwell time at each position, and a vector defining the orientation of the spray gun relative to the object geometry; and generating a robot motion database containing a plurality of motion step files.

7. The spray coating process of claim 4, wherein the three dimensional model is created using a computer aided design software application.

8. The spray coating process of claim 4, wherein the additional mathematical identifiers comprise an area, a centroid location, and a facet normal.

9. The spray coating process of claim 1, wherein the process is in algorithm form executed by a computer.

10. The spray coating process of claim 5, wherein the spray patterns are numerically characterized as a series of nth degrees polynomials representing thickness at various slices through the test plate, a cone angle, and the height of characterization.

11. The spray coating process of claim 4, wherein the step of determining which portions of the object geometry are visible at each motion step comprises determining which facets fall within the spray pattern by determining which facet centroids are within the spray pattern at the current position; and subjecting these facets to a shadowing test to exclude all facets occluded by facets closer to the spray gun by using the barycentric coordinates of one facet relative to another.

12. The spray coating process of claim 1, further comprising using a glancing factor on a convex surface geometry to account for spray coating that stick to a flat surface but scatter from a curved surface.

13. The spray coating process of claim 1, further comprising using a rebounding factor on a concave surface geometry to account for spray coating that scatter off of a portion of a curved surface but are captured by another portion.

* * * * *